United States Patent [19]

Schnable et al.

[11] 4,433,008
[45] Feb. 21, 1984

[54] DOPED-OXIDE DIFFUSION OF PHOSPHORUS USING BOROPHOSPHOSILICATE GLASS

[75] Inventors: George L. Schnable, Lansdale, Pa.; Edward A. James, Pennington, N.J.

[73] Assignee: RCA Corporation, New York, N.Y.

[21] Appl. No.: 377,197

[22] Filed: May 11, 1982

[51] Int. Cl.³ .............................................. B05D 5/12
[52] U.S. Cl. ........................................ 427/85; 427/93; 427/95; 427/397.7
[58] Field of Search .................. 427/85, 93, 95, 397.7, 427/376.2, 126.2

[56] References Cited

U.S. PATENT DOCUMENTS

| | | | |
|---|---|---|---|
| 3,365,793 | 1/1968 | Nechtow | 427/85 |
| 3,481,781 | 12/1979 | Kern | 117/215 |
| 3,886,569 | 5/1975 | Basi et al. | 357/54 |
| 4,191,603 | 3/1980 | Garbarino | 427/95 |
| 4,349,584 | 9/1982 | Flatley et al. | 427/85 |
| 4,363,830 | 12/1982 | Hsu et al. | 427/85 |

OTHER PUBLICATIONS

W. Kern et al. "Chemical Vapor Deposition of Silicate Glasses for Use with Silicon Devices", *J. Electrochem. Soc.*, Apr. 1976.

W. Kern, "Chemical Vapor Deposition Systems for Glass Passivation of Integrated Circuits", *Solid State Technology*, Dec. 1975.

K. Chow et al., "Phosphorus Concentration of Chemical Vapor Deposited Phosphosilicate Glass", vol. 124, No. 7.

*Primary Examiner*—S. L. Childs
*Attorney, Agent, or Firm*—Birgit E. Morris; R. Hain Swope

[57] ABSTRACT

The invention is a method for diffusing phosphorus into the surface of a silicon substrate using borophosphosilicate glass as the phosphorus source.

5 Claims, No Drawings

DOPED-OXIDE DIFFUSION OF PHOSPHORUS USING BOROPHOSPHOSILICATE GLASS

The invention relates to a method of diffusing phosphorus into silicon and, in particular, to the use of a borophosphosilicate glass (hereinafter BPSG) as the phosphorus source.

BACKGROUND OF THE INVENTION

In the fabrication of semiconductor devices, phosphorus is diffused into the surface of a semiconductor such as silicon to form n-type conductivity regions. Phosphorus is deposited on a surface of a silicon wafer in either elemental form or in the form of a phosphorus-doped oxide, typically a phosphosilicate glass. The silicon wafer, with the layer thereon, is then heated to a temperature, typically in the range between about 1000° C. and 1200° C. for a period of time to diffuse the phosphorus into the silicon with the time required for the diffusion increasing with decreasing temperature.

With increasing diffusion temperatures warpage of the silicon wafer can occur and the distribution of dopants added in prior diffusions is changed. It would be desirable to have a method for diffusing phosphorus into a semiconductor such as silicon which can be carried out at a low temperature without requiring an excessive period of time for the diffusion to occur.

SUMMARY OF THE INVENTION

The invention is a method for diffusing phosphorus into a surface of a semiconductor such as silicon which includes using a borophosphosilicate glass as the phosphorus source. The layer of borophosphosilicate glass is deposited on the surface of the semiconductor and then heated to a temperature less than about 1000° C. to drive the phosphorus into the surface. Using this method, diffusion temperatures between about 700° and 950° C. can be used without excessively increasing the time required for the diffusion to take place.

DETAILED DESCRIPTION OF A PREFERRED EMBODIMENT

Since boron and phosphorus are, respectively, acceptor and donor dopants in silicon, and since they have essentially equal diffusion coefficients in silicon, BPSG would not appear to be useful a phosphorus diffusion source for fabrication of devices in silicon. We have discovered, however, that BPSG can serve as a very effective low-temperature phosphorus diffusion source in the fabrication of devices in silicon. We believe that the distribution coefficient at the silicon-silicon oxide interface is substantially higher for phosphorus than for boron since phosphorus oxides are preferentially reduced at the silicon interface as compared to boron oxides. Thus, phosphorus will be the principal dopant in a subsequently diffused layer. Diffusion of phosphorus and boron in an oxide glass increases with increasing temperature, increasing markedly at the softening temperature of the glass. The effect of the boron oxide in the borophosphosilicate glass is principally to lower the softening temperature of the glass thus enabling phosphorus atoms in a thicker layer adjacent to the interface to diffuse to the interface and react with the silicon for reduction to elemental phosphorus. Because of the higher surface concentration of phosphorus and the concentration-enhanced phosphorus diffusion, phosphorus diffuses more deeply than boron, thereby producing only a n-type layer.

A BPSG layer may be deposited on the surface of a semiconductor such as silicon by chemical vapor deposition as disclosed by Kern in U.S. Pat. No. 3,481,781, incorporated herein by reference, and in the Journal of the Electrochemical Society, 117, pages 562–573 (1970). Reactors suitable for the deposition of BPSG are disclosed by Kern in Solid State Technology, pages 25–33 (Dec., 1975). Typically, a semiconductor substrate is heated to a temperature between about 300° C. and 500° C. in an atmosphere containing flowing silane, diborane, phosphine, oxygen and a neutral gas such as nitrogen. The deposition rate depends upon the substrate temperature, the relative concentrations of the constituent gases and the gas flow rates. The deposition rate of BPSG by co-oxidation of the hydrides is observed to be less than that for the components, for example phosphosilicate glass, indicating that there is an inhibition of the oxidation process.

The use of BPSG glass as a phosphorus diffusion source provides a flexibility not present with phosphosilicate glass since the softening temperature of BPSG and its phosphorus content and thus the amount diffused, can be independently controlled. The boron and phosphorus concentrations in BPSG may be between 1 and 20 weight percent, are typically between about 1 and 10 weight percent and are preferably between about 3 and 7 weight percent. The concentrations of boron and phosphorus for several borophosphosilicate glasses and the corresponding softening temperatures of these glasses are listed in the Table.

TABLE

| Boron (wt. %) | Phosphorus (wt. %) | Softening Temperature |
| --- | --- | --- |
| 4.6 | 4.3 | 900–950° C. |
| 5.6 | 4.9 | 800–850° C. |
| 6.7 | 5.6 | 700–750° C. |

After the glass has been deposited on the semiconductor surface, the semiconductor with the glass layer thereon is heated to a temperature typically less than 1000° C. and preferably near or above the softening temperature of the glass in an inert atmosphere for a period of time sufficient to diffuse the desired amount of phosphorus into the semiconductor. The period of time required depends upon the softening temperature and phosphorus content of the glass, the temperature to which the semiconductor is actually heated and the desired sheet resistivity of the n-type region thus formed. If the boron and phosphorus concentrations in the glass are between about 3 and about 7 weight percent, the softening temperature and the temperature to which the semiconductor is heated is between 700° and 950° C.

The invention is illustrated by the following Examples but is not meant to be limited to the details therein.

EXAMPLE I

A p-type silicon wafer having a bulk resistivity of about 50 ohm-cm was cleaned in a HF dip, rinsed, dried, mounted in a hot plate rotary reactor and heated to a temperature of 430° C. The gas flow rates into the reactor were: 8200 cc/min. of $N_2$; 1031 cc/min. of $O_2$; 1510 cc/min. of 4% $SiH_4$ in $N_2$; 378 cc/min. of 2% $B_2H_6$ in $N_2$; and 525 cc/min. of 1% $PH_3$ in $N_2$. The deposition time was 6.2 minutes and the thickness of the resulting BPSG layer was 800 nanometers. The layer contained 4.3 weight percent of phosphorus and 4.6 weight percent of boron and had a softening temperature of about 900° C. The silicon wafer with the glass layer thereon was heated for 60 minutes at 900° C. in a nitrogen atmosphere. The glass layer was then stripped using buffered HF. The silicon wafer was found to have a n-type surface layer having a thickness of about 0.5 micrometers and a sheet resistivity of 4.5 ohms per square, as measured by the four-point probe method.

EXAMPLE II

A BPSG layer was deposited on an n-type silicon wafer having a bulk resistivity of about 50 ohm-cm using the method described above. After the same diffusion process as above, the silicon wafer had an n-type surface layer having a thickness of about 0.5 micrometers and a sheet resistivity of 6 ohms per square, as measured by the four-point probe method.

This wafer was then angle lapped at 10° and stained to delineate regions of different conductivity type using a dilute solution containing HF and $CuSO_4$ for n-type regions and a dilute solution of $HNO_3$ and HF for p-type regions. Using optical microscopy no p-type region could be seen, thereby indicating that only a higher conductivity n-type region was formed in the n-type silicon wafer.

COMPARATIVE EXAMPLE

A phosphosilicate glass containing 4 weight percent phosphorus was deposited on the surface of a p-type silicon wafer having a bulk resistivity of about 50 ohm-cm using the method described above. The wafer was heated for 120 minutes at 1100° C. and the glass layer stripped. The wafer was found to have an n-type surface layer having a sheet resistivity of about 9 ohms/per square using the four-point probe method.

This result indicates that while the heating process is carried out at a higher temperature for a longer period of time using PSG as the phosphorus source the amount of phosphorus which diffused into the silicon wafer was less than that using a BPSG source.

We claim:

1. A method of diffusing phosphorus into a silicon substrate, said method comprising:
   depositing directly on a surface of the substrate a layer of a borophosphosilicate glass; and heating the substrate and the layer to a temperature whereby phosphorus diffuses into the silicon and boron is retained in the glass, said temperature being below about 1000° C.
2. The method of claim 1 wherein the temperature is between about 700° C. and about 950° C.
3. The method according to claim 1 wherein the borophosphosilicate glass contains less than about 20 weight percent of boron and of phosphorus.
4. The method of claim 3 wherein the borophosphosilicate glass contains between about 1 and about 10 percent by weight of boron and of phosphorus.
5. The method of claim 4 wherein the borophosphosilicate glass contains between about 3 and 7 weight percent of boron and of phosphorus.

* * * * *